US007355322B2

(12) United States Patent
Miyazaki

(10) Patent No.: US 7,355,322 B2
(45) Date of Patent: *Apr. 8, 2008

(54) ULTRASONIC TRANSDUCER, ULTRASONIC SPEAKER AND METHOD OF DRIVING AND CONTROLLING ULTRASONIC TRANSDUCER

(75) Inventor: Shinichi Miyazaki, Nagano (JP)

(73) Assignee: Seiko Epson Corporation (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/155,034

(22) Filed: Jun. 16, 2005

(65) Prior Publication Data

US 2005/0280333 A1 Dec. 22, 2005

(30) Foreign Application Priority Data

Jun. 18, 2004 (JP) ............................ 2004-181065

(51) Int. Cl.
*H01L 41/09* (2006.01)
*H02N 1/08* (2006.01)

(52) U.S. Cl. ................................ 310/316.01; 310/309

(58) Field of Classification Search .......... 310/316.01, 310/365, 366, 309, 317; 381/173, 191, 111, 381/116, 120; 600/459
See application file for complete search history.

(56) References Cited

U.S. PATENT DOCUMENTS 5,287,331 A * 2/1994 Schindel et al. ............ 367/140
5,569,968 A * 10/1996 Lal et al. .................... 310/322
5,757,927 A * 5/1998 Gerzon et al. ................ 381/20
6,909,223 B2 * 6/2005 Miyazawa .................. 310/328
7,005,776 B1 * 2/2006 Iino et al. .............. 310/316.01
2002/0135329 A1 * 9/2002 Neufeld et al. ............. 318/116
2005/0213785 A1 * 9/2005 Koura et al. ................ 381/190
2005/0281419 A1 * 12/2005 Miyazaki et al. ........... 381/191

FOREIGN PATENT DOCUMENTS

JP 39-8261 5/1939
JP 2003-47085 2/2003
JP 2004-112212 4/2004

OTHER PUBLICATIONS

Communication from Japanese Patent Office regarding counterpart application.

* cited by examiner

*Primary Examiner*—Darren Schuberg
*Assistant Examiner*—Derek Rosenau
(74) *Attorney, Agent, or Firm*—Harness, Dickey & Pierce, P.L.C.

(57) ABSTRACT

An ultrasonic transducer including: a fixed electrode; a vibrating film placed opposite to a surface of the fixed electrode and having a conducting layer; a member that holds the fixed electrode and vibrating film; the fixed electrode including a driving-use fixed electrode formed to drive the ultrasonic transducer, and a detecting-use fixed electrode formed to detect an amplitude of the vibrating film; and a unit that controls a signal to be applied to the driving-use fixed electrode based on a magnitude of the amplitude of the vibrating film detected by the detecting-use fixed electrode so that the magnitude of the vibration of the vibrating film becomes in proportion to an input signal, wherein when an alternating current signal is applied between the fixed electrode and the conducting layer of the vibrating film, the ultrasonic transducer generates an ultrasonic wave.

11 Claims, 9 Drawing Sheets

ULTRASONIC TRANSDUCER, ULTRASONIC SPEAKER AND METHOD OF DRIVING AND CONTROLLING ULTRASONIC TRANSDUCER

RELATED APPLICATIONS

This application claims priority to Japanese Patent Application No. 2004-181065 filed Jun. 18, 2004 which is hereby expressly incorporated by reference herein in its entirety.

BACKGROUND

1. Technical Field

The present invention relates to an ultrasonic transducer, an ultrasonic speaker and a method of driving and controlling the ultrasonic transducer. More specifically, the invention relates to an electrostatic ultrasonic transducer capable of outputting sonic waves to input signals, an ultrasonic speaker and a method of driving and controlling the ultrasonic transducer.

2. Related Art

Piezoelectric and electrostatic transducers are typical ultrasonic transducers. A piezoelectric transducer incorporates a piezoelectric element, such as a piezo device, as a vibration body, and is a resonance-type transducer. With this type of transducer, a resonant frequency band is utilized for driving. Therefore, a piezoelectric transducer has the feature that it can efficiently generate a high sound pressure and has a narrow band sound pressure-frequency characteristic. In contrast, an electrostatic transducer has an electrode film that is vibrated by causing an electrostatic force to act between a fixed electrode and the electrode film, and has a wide band sound pressure-frequency characteristic.

It is known that when a modulated wave (sonic wave) resulting from the amplitude modulation of an ultrasonic carrier of a high sound pressure by an acoustic signal in an audio band is directed into the air, the sound velocity is made higher at locations of a high sound pressure and lower at locations of a low sound pressure because the air has nonlinearity, distorting the waveform of the sonic wave as the sonic wave propagates in the air. This leads to the accumulation of waveform distortion to gradually attenuate components of the carrier and thus components of the acoustic signal in the audio band used in the modulation are gradually self-demodulated as the sonic wave propagates in the air. This phenomenon is referred to as parametric array. A self-demodulated audible sound has a sharp directivity due to transportation by an ultrasonic wave and as such, a speaker to which the principle is applied is referred to as e.g., a parametric speaker or ultra-directional speaker (ultrasonic speaker).

A conventional ultra-directional speaker commonly incorporates a resonance-type transducer because an ultra-directional speaker (ultrasonic speaker) needs the generation of a high sound pressure, (see e.g., JP-A-2003-47085 and JP-A-2004-112212). However, such a conventional ultra-directional speaker is often regarded as being lower in reproduction sound quality in comparison to a loudspeaker and therefore is only used for voice, e.g. a local announcement or a comment on an exhibit. As described above, a resonance-type transducer has a narrow band sound pressure-frequency characteristic and is limited in its drive frequency. As such, it has the following problems: it is difficult to enhance its reproduction sound quality; and it is hard to adjust the reproduction range. Also, there is a problem in that caution must be exercised in handling a resonance-type transducer because it is sensitive to excessive input and easy to damage an element therein.

On the other hand, an electrostatic transducer is smaller than a resonance-type transducer in output sound pressure per unit area, but has a wide band sound pressure-frequency characteristic. Therefore, an electrostatic transducer has the following features: it is easy to enhance its reproduction sound quality; and it is also easy to adjust the reproduction range. A vibration body (film) of an electrostatic transducer is more flexible than that of a resonance-type transducer. Therefore, an electrostatic transducer has the following features: it is less prone to being damaged by excessive input; and it doesn't have to be handled nervously (as cautiously) as in handling a resonance-type transducer.

Thus, from the viewpoints of the enhancement of the reproduction sound quality and the ease of handling, it is preferable to use an electrostatic transducer to form an ultra-directional speaker.

Electrostatic transducers may be roughly classified into two types, i.e., pull type and push-pull type. Their advantages and drawbacks are as follows.

FIGS. 8A and 8B are views for explaining a concept for driving a pull type electrostatic ultrasonic transducer. In the transducer, alternating current (AC) signals superimposed on a direct current (DC) bias voltage output by a DC bias source are applied between a fixed electrode 20 and a vibrating-electrode film 10 including a vibrating film (insulating film) and a conducting layer deposited on the vibrating film to vibrate the vibrating-electrode film 10 according to the AC signals, thereby outputting ultrasonic waves.

FIG. 8A shows a state of amplitude of the vibrating-electrode film 10 when a plus (+) side output of an AC signal with a direct current (DC) bias voltage superimposed thereon is applied to the vibrating-electrode film 10. FIG. 8B shows a state of amplitude of the vibrating-electrode film 10 when a minus (−) side output of the AC signal with a DC bias voltage superimposed thereon is applied to the vibrating-electrode film 10.

In the case of the state shown in FIG. 8A, the potential difference between the fixed electrode 20 and the vibrating-electrode film 10 is enlarged to cause a strong electrostatic force (attracting force) to act between the fixed electrode 20 and the vibrating-electrode film 10, whereby a center portion of the vibrating-electrode film 10 is attracted toward the fixed electrode 20. In the case of the state shown in FIG. 8B, the potential difference between the fixed electrode 20 and the vibrating-electrode film 10 is reduced to weaken the electrostatic force (attracting force) between the fixed electrode 20 and the vibrating-electrode film 10, whereby the center portion of the vibrating-electrode film 10 is drawn back in the direction opposite to the fixed electrode 20 by an elastic restoring force. In this way, the vibrating-electrode film 10 is vibrated according to AC signals to output ultrasonic waves.

Unlike a push-pull type electrostatic ultrasonic transducer (which is to be described later), a pull type electrostatic ultrasonic transducer like this doesn't require the provision of a through-hole to allow sonic waves to pass therethrough or the like in the fixed electrode. Therefore, a pull type electrostatic ultrasonic transducer is advantageous in that: its aperture ratio is large; and it is easy to secure a sound pressure. However, a pull type electrostatic ultrasonic transducer has the drawback that the distortion of its output waveform is made larger. This is because the constituents that contribute to the vibration are only an electrostatic attracting force and an elastic restoring force of the film.

FIGS. 9A-9C are views of explaining a concept for driving a push-pull type electrostatic ultrasonic transducer. In a push-pull type electrostatic ultrasonic transducer, an upside fixed electrode 20*a* and a downside fixed electrode 20*b* are provided on the opposing sides of a vibrating-electrode film 10 so as to be opposed to the film 10. A DC bias source supplies a positive side DC bias to the vibrating-electrode film 10 and then an AC signal is applied between the upside fixed electrode 20*a* and the downside fixed electrode 20*b*.

FIG. 9A shows a state of amplitude of the vibrating-electrode film 10 when the AC signal is zero (0) volts. In this case, the vibrating-electrode film 10 is situated in its neutral position (in the middle between the upside fixed electrode 20*a* and the downside fixed electrode 20*b*).

FIG. 9B shows a state of amplitude of the vibrating-electrode film 10 when a plus voltage of the AC signal is applied to the upside fixed electrode 20*a* and a minus voltage of the AC signal is applied to the downside fixed electrode 20*b*. A center portion of the vibrating-electrode film 10 is attracted toward the downside fixed electrode 20*b* due to an electrostatic force (attracting force) between the film 10 and the downside fixed electrode 20*b* and an electrostatic force (repulsion force) between the film 10 and the upside fixed electrode 20*a*.

FIG. 9C shows a state of amplitude of the vibrating-electrode film 10 when a minus voltage of the AC signal is applied to the upside fixed electrode 20*a* and a plus voltage of the AC signal is applied to the downside fixed electrode 20*b*. The center portion of the vibrating-electrode film 10 is attracted toward the upside fixed electrode 20*a* due to an electrostatic force (attracting force) between the film 10 and the upside fixed electrode 20*a* and an electrostatic force (repulsion force) between the film 10 and the downside fixed electrode 20*b*.

In this way, the vibrating-electrode film 10 is vibrated according to AC signals to output sonic waves.

A push-pull type electrostatic ultrasonic transducer like this has the advantage that the distortion of its output waveform is made smaller. This is because both an electrostatic attracting force and an electrostatic repulsion force act on the vibrating film, namely plus and minus electrostatic forces act on the film symmetrically. However, a push-pull type electrostatic ultrasonic transducer outputs sonic waves through a through-hole provided in the fixed electrode and therefore it has the following drawbacks: its aperture ratio is small; and it is hard to secure sound pressure.

In the case where an electrostatic transducer is used as an ultra-directional speaker, there is the following specific problem: even if an ideal amplitude-modulated wave in an ultrasonic wave band is input to the speaker, when the transducer outputs a waveform (carrier) whose plus-and-minus asymmetric distortion is large, components of the distortion make audible sound components and the audible sounds in addition to ultrasonic wave components are to be output directly from the speaker, degrading the directivity in audibility. This is because electrostatic transducers have wide frequency band sound pressure characteristics (i.e. even when an audible sound is directly input to the transducers, a sound pressure is output in its own way). Hence, it can be said that this is a problem specific to transducers having wide frequency band characteristics. Therefore, in order to avoid such problem, it is desirable to use a push-pull type transducer which can output a waveform with a smaller distortion in comparison to a pull type one.

However, a push-pull type transducer requires the provision of a through-hole to allow sonic waves to penetrate therethrough in the fixed electrode in order to emit sounds to the outside. This poses the following problem: it is difficult to appropriately raise a sound pressure because increasing the aperture ratio reduces electrostatic force acting on the vibrating film thereby lowering sound pressure, and reversely increasing an electrostatic force per unit area lowers the aperture ratio. In addition, a push-pull type ultrasonic transducer has the following problem: it is costly because it is more difficult to manufacture in comparison to a pull type, and requires high precision in machining and positioning.

The first requirement to realize a high directional speaker is to generate a high sound pressure. A pull type transducer can realize the generation of a high sound pressure more easily in comparison to a push-pull type transducer.

Now considered is the case where a sine wave drive signal is supplied to a pull type electrostatic transducer to drive it. In the pull type electrostatic transducer, a DC bias voltage is applied between the vibrating-electrode film and the fixed electrode to cause an electrostatic attracting force to work thereby to apply a tension force to the vibrating film. In this condition, an AC signal is superimposed on the DC bias voltage to force the electrostatic attracting force to fluctuate, whereby the vibrating film is vibrated.

As described above, only an electrostatic attracting force and an elastic force (restoring force) caused by the film act on the vibrating film, and therefore the forcedly vibrating force acting on the film is just an electrostatic attracting force. Hence, it is harder to vibrate the vibrating film symmetrically in plus and minus directions (i.e. upward and downward) in comparison to a push-pull type transducer in which an attracting force and a repulsion force act on a vibrating film symmetrically from both the up and down side fixed electrodes.

FIG. 10 is a view showing an example in which a vibrating waveform is distorted asymmetrically in the up and down directions. As shown in the drawing, even when a sine wave signal (i.e. a waveform drawn by a dotted line) having plus-side and minus-side amplitudes identical in size with each other is input, the signal vibrates asymmetrically in the plus and minus directions as shown in the solid line.

Therefore, in the case where a conventional pull type transducer is used to constitute an ultra-directional speaker, there is the problem that a bilaterally asymmetrical distortion is created in its output waveform (carrier), degrading the directivity in audibility.

SUMMARY

It is an advantage of the invention to provide an ultrasonic transducer, an ultrasonic speaker, and a method of driving and controlling the ultrasonic transducer, which allow a pull type electrostatic transducer to be arranged as a high-directional speaker, provided that in the pull type electrostatic transducer, a bilaterally (upward and downward) asymmetrical distortion of its output vibrating waveform is suppressed and audible sound components directly emitted by the transducer are reduced.

An ultrasonic transducer according to an aspect of the invention includes:

a fixed electrode;

a vibrating film placed opposite to a surface of the fixed electrode and having a conducting layer;

a member that holds the fixed electrode and vibrating film;

the fixed electrode including:

a driving-use fixed electrode formed to drive the ultrasonic transducer; and a detecting-use fixed electrode formed to detect an amplitude of the vibrating film; and a unit that controls a signal to be applied to the driving-use fixed electrode based on a magnitude of the amplitude of the vibrating film detected by the detecting-use fixed electrode so that the magnitude of the amplitude of the vibrating film vibrates in proportion to an input signal, wherein when an alternating current (AC) signal is applied between the fixed electrode and the conducting layer of the vibrating film, the ultrasonic transducer generates an ultrasonic wave.

According to the arrangement, in the electrostatic ultrasonic transducer, a part of the fixed electrode is used as a driving-use fixed electrode of the ultrasonic transducer, and a part of the fixed electrode is used as a detecting-use fixed electrode (electrostatic sensor). Based on the amplitude information of the vibrating film detected by the detecting-use fixed electrode, plus-side and minus-side halves of a signal to be supplied to the driving-use fixed electrode are separately amplified with different amplification factors so that the amplitude of the vibrating film becomes symmetrical in the plus and minus directions with respect to, namely faithfully to (in proportion to) a plus and minus symmetrical input signal, whereby the ultrasonic transducer is driven and controlled.

Thus, it becomes possible to suppress a bilaterally asymmetrical distortion in an output vibrating waveform in the electrostatic ultrasonic transducer, and therefore audible sound components directly emitted by the ultrasonic transducer can be reduced. Hence, it also becomes possible to arrange an electrostatic ultrasonic transducer as an ultrasonic speaker with a higher directivity.

In the ultrasonic transducer according to an aspect of the invention, the fixed electrode may be formed so as to have a plurality of electrodes insulated from each other, a part of the fixed electrode is formed as the driving-use fixed electrode, and a part of the fixed electrode is formed as the detecting-use fixed electrode for amplitude detection.

According to the arrangement, detecting-use fixed electrodes may be used to detect an amplitude of the vibrating film, for example. In this case, the average value of amplitude voltages detected by the detecting-use fixed electrodes is used as a detected output.

This allows a center portion of the ultrasonic transducer, where a maximum amplitude can be achieved, to be used for the driving-use fixed electrode.

In the ultrasonic transducer according to an aspect of the invention, the vibrating film may be an insulative film having a conducting layer formed on one side thereof covering the insulative film, and the other side of the insulative film is held opposite to the fixed electrode.

According to the arrangement, for example, it is possible to prevent a short circuit between the vibrating film and fixed electrode when a part of the vibrating film touches the fixed electrode.

In the ultrasonic transducer according to an aspect of the invention, a cavity may be provided between the fixed electrode and vibrating film.

According to the arrangement, a cavity (gap) is provided extending entirely over the space between the fixed electrode and the vibrating film. This allows the ultrasonic transducer to make a speaker intended for a loudspeaker, in which emphasis is put on reproduction in an audible sound band.

In the ultrasonic transducer according to an aspect of the invention, reentrant and protrudent portions (protruding and recessed portions) may be formed in a surface of the fixed electrode opposite to the vibrating film.

According to the arrangement, reentrant and protrudent portions are provided in a surface of the driving-use fixed electrode opposite to the vibrating film thereby to keep the condition where the vibrating film is in contact with the protrudent portions. Thus, a cavity is formed only between the reentrant portions of the fixed electrode and the vibrating film, which allows only the portions of the vibrating film corresponding to the reentrant portions of the fixed electrode to vibrate (or makes the vibrating area smaller). Therefore, the sensitivity (the capability to respond) with respect to an ultrasonic wave band can be improved in addition to the advantage that a bilaterally asymmetrical distortion in the output vibrating waveform is suppressed.

Also, an ultrasonic transducer according to an aspect of the invention includes:

an amplitude voltage-detecting unit that measures a voltage between the detecting-use fixed electrode and the conducting layer of the vibrating film thereby to detect an amplitude voltage produced by an amplitude of the vibrating film;

a plus-side amplitude voltage level-detecting unit that detects a plus(+) side amplitude voltage level of the amplitude voltage detected by the amplitude voltage-detecting unit; and a minus-side amplitude voltage level-detecting unit that detects a minus(−) side amplitude voltage level of the amplitude voltage detected by the amplitude voltage-detecting unit.

According to the arrangement, in the amplitude voltage-detecting unit, a combination of the detecting-use fixed electrode and the conducting layer of the vibrating film is used as an electrostatic sensor to measure the voltage between the detecting-use fixed electrode and the conducting layer, followed by detecting a vibrating (amplitude) state of the vibrating film. In this case, based on the amplitude voltage detected by the amplitude voltage-detecting unit, the plus-side amplitude voltage level-detecting unit detects the plus(+) side amplitude voltage level thereby to detect a vibrating state of the vibrating film on one side thereof (i.e. plus side). The minus-side amplitude voltage level-detecting unit detects the minus(−) side amplitude voltage level thereby to detect a vibrating state of the vibrating film on the other side (i.e. minus side).

This makes it possible to detect amplitude states of the vibrating film with respect to plus and minus drive signals, whereby an asymmetrical distortion of the vibrating film can be detected.

An ultrasonic transducer according to an aspect of the invention includes:

a plus-side error-detecting unit that detects an error between the plus-side amplitude voltage level detected by the plus-side amplitude voltage level-detecting unit and a targeted voltage level;

a minus-side error-detecting unit that detects an error between the minus-side amplitude voltage level detected by the minus-side amplitude voltage level-detecting unit and a targeted voltage level;

a plus-side variable gain-regulating unit that regulates a plus-side gain of an AC voltage to be applied to the driving-use fixed electrode based on a result of error detection by the plus-side error-detecting unit; and a minus-side variable gain-regulating unit that regulates a minus-side gain of the AC voltage to be applied to the driving-use fixed electrode based on a result of error detection by the minus-side error-detecting unit.

According to the arrangement, the plus-side error-detecting unit detects the error between a plus-side vibrating voltage level detected by the amplitude voltage-detecting unit and the targeted voltage level. Further, the minus-side error-detecting unit detects the error between a minus-side amplitude voltage level detected by the amplitude voltage-detecting unit and the targeted voltage level. Then, based on the result of error detection by the plus-side error-detecting unit, the plus-side variable gain-regulating unit regulates a plus-side gain of an AC signal to be applied to the driving-use fixed electrode. Also, based on the result of error detection by the minus-side error-detecting unit, the minus-side variable gain-regulating unit regulates the minus-side gain of the AC signal to be applied to the driving-use fixed electrode.

Thus, it becomes possible to regulate the plus and minus gain of a signal to drive the ultrasonic transducer, whereby a bilaterally asymmetrical distortion in the ultrasonic transducer can be suppressed.

Further, the ultrasonic transducer according to an aspect of the invention may have a manual regulation unit that allows gains for the plus-side variable gain-regulating unit and minus-side variable gain-regulating unit to be regulated manually.

According to the arrangement, it becomes possible to regulate the gains manually (by hand) in the plus-side variable gain-regulating unit that regulates a plus-side gain of a signal to drive the ultrasonic transducer and in the minus-side variable gain-regulating unit that regulates a minus side gain of the signal.

Thus, ultrasonic transducers can be shipped in the best condition if the gains are regulated manually (by hand) in advance at the time of factory shipment, for example.

An ultrasonic speaker according to an aspect of the invention includes:

the ultrasonic transducer; and a modulation unit that modulates a carrier of an ultrasonic wave band with an acoustic signal of an audio band thereby to create a modulated wave, the ultrasonic speaker being arranged so that the modulated wave is supplied to the ultrasonic transducer from the modulation unit.

According to the arrangement, the ultrasonic transducer in which a bilaterally asymmetrical distortion in the output vibrating waveform is suppressed can be used to arrange an ultrasonic speaker capable of reproducing demodulated sounds with a high directivity.

A method of driving and controlling an ultrasonic transducer according to an aspect of the invention is a method of driving and controlling an ultrasonic transducer having a fixed electrode, a vibrating film placed opposite to a surface of the fixed electrode and having a conducting layer, a member that holds the fixed electrode and the vibrating film, wherein the ultrasonic transducer generates an ultrasonic wave when an AC signal is applied between the fixed electrode and the conducting layer of the vibrating film, and includes the steps of:

using a part of the fixed electrode as a driving-use fixed electrode to drive the ultrasonic transducer and using a part of the fixed electrode as a detecting-use fixed electrode to detect an amplitude of the vibrating film; and controlling a signal to be applied to the driving-use fixed electrode based on a magnitude of vibration of the vibrating film detected by the detecting-use fixed electrode so that the magnitude of vibration of the vibrating film becomes proportional to an input signal.

According to the method, in the electrostatic ultrasonic transducer, a part of the fixed electrode is used as a driving-use fixed electrode of the ultrasonic transducer, and a part of the fixed electrode is used as a detecting-use fixed electrode (electrostatic sensor). Based on the amplitude information of the vibrating film detected by the detecting-use fixed electrode, plus-side and minus-side halves of a signal to be supplied to the driving-use fixed electrode are separately amplified with different amplification factors so that the amplitude of the vibrating film becomes symmetrically in plus and minus directions, namely the vibration film vibrates faithfully to (in proportion to) a plus and minus symmetrical input signal, whereby the ultrasonic transducer is driven and controlled.

Thus, it becomes possible to suppress a bilaterally asymmetrical distortion of an output vibrating waveform in the electrostatic ultrasonic transducer, and therefore audible sound components directly emitted by the ultrasonic transducer can be reduced. Hence, it also becomes possible to arrange an electrostatic ultrasonic transducer as an ultrasonic speaker with a higher directivity.

Also, the method of driving and controlling an ultrasonic transducer according to an aspect of the invention may further include the steps of:

measuring a voltage between the detecting-use fixed electrode and the conducting layer of the vibrating film thereby to detect an amplitude voltage produced by the amplitude of the vibrating film;

detecting a plus(+) side amplitude voltage level of the amplitude voltage detected in the amplitude voltage detecting step;

detecting a minus(−) side amplitude voltage level of the amplitude voltage detected in the amplitude voltage detecting step;

detecting an error between the plus-side amplitude voltage level detected in the plus-side amplitude voltage level detecting step and a targeted voltage level;

detecting an error between the minus-side amplitude voltage level detected in the minus-side amplitude voltage level detecting step and a targeted voltage level;

regulating a plus-side gain of an AC signal to be applied to the driving-use fixed electrode based on a result of error detection according to the plus-side error detecting step; and regulating a minus-side gain of the AC signal to be applied to the driving-use fixed electrode based on a result of error detection according to the minus-side error detecting step.

According to the method, in the amplitude voltage detecting step, a combination of the detecting-use fixed electrode and the conducting layer of the vibrating film is used as an electrostatic sensor to measure the voltage between the detecting-use fixed electrode and the conducting layer, followed by detecting a vibrating (amplitude) state of the vibrating film. In this case, based on the amplitude voltage detected according to the amplitude voltage detecting step, the plus-side amplitude voltage level is detected thereby to detect a vibrating state of the vibrating film on one side thereof (i.e. plus side) according to the plus-side amplitude voltage level detecting step. Further, according to the minus-side amplitude voltage level detecting step, the minus(−) side amplitude voltage level is detected thereby to detect a vibrating state of the vibrating film on the other side (i.e. minus side).

Then, according to the plus-side error detecting step, the error between a plus-side vibrating voltage level detected in the amplitude voltage detecting step and the targeted voltage level is detected. Further, according to the minus-side error detecting step, the error between a minus-side amplitude voltage level detected in the voltage detecting step and the targeted voltage level is detected. Then, based on the result of error detection according to the plus-side error detecting step, a plus-side gain of an AC signal to be applied to the driving-use fixed electrode is regulated in the plus-side variable gain regulating step. Also, based on the result of error detection according to the minus-side error detecting step, the minus-side gain of the AC signal to be applied to the driving-use fixed electrode is regulated in the minus-side variable gain regulating step.

Thus, the following are made possible: detecting amplitude states of the vibrating film with respect to plus and minus drive signals; based on the results of the detection, regulating gains for the plus and minus signals to drive the ultrasonic transducer; and thereby suppressing a bilaterally asymmetrical distortion in the ultrasonic transducer.

BRIEF DESCRIPTION OF THE DRAWINGS

The invention will be described with reference to the accompanying drawings, wherein like numbers reference like elements, and wherein.

DETAILED DESCRIPTION

Now, the preferred embodiments of the invention will be described in reference to the drawings.

Arrangement of Ultrasonic Transducer According to the Invention

Figure 1A:
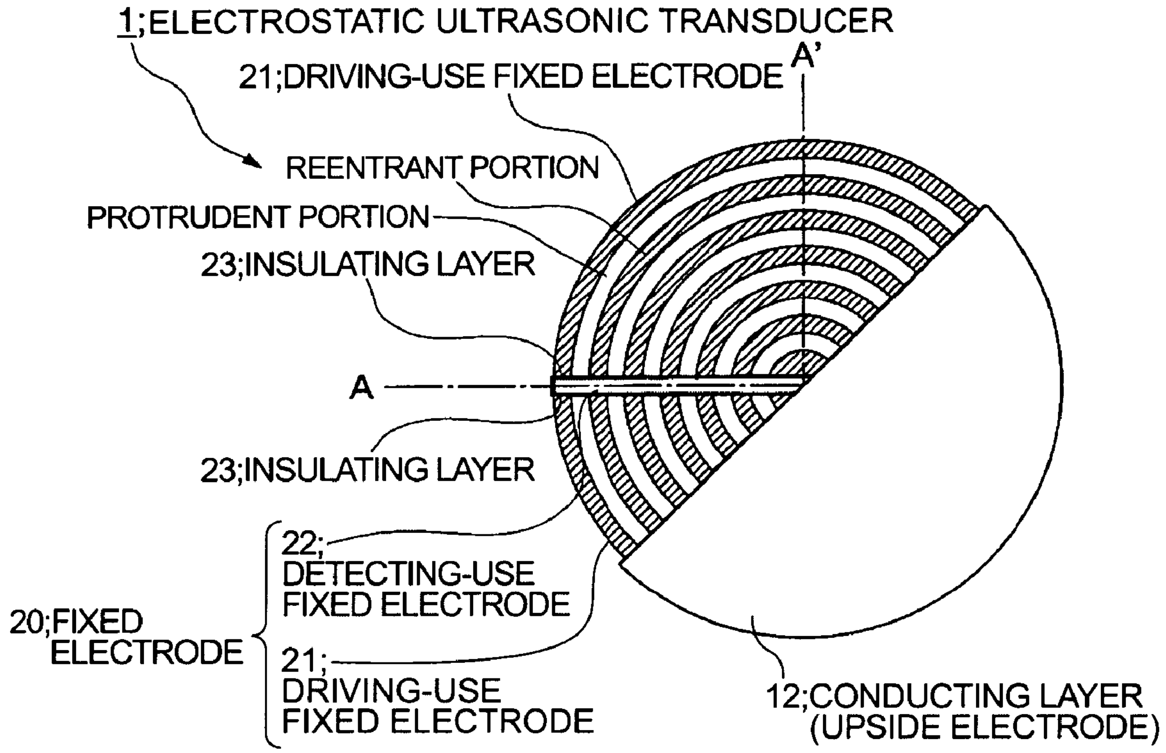
FIGS. 1A and 1B are views showing a first example of arrangement of an ultrasonic transducer according to the invention.
Figure 1B:
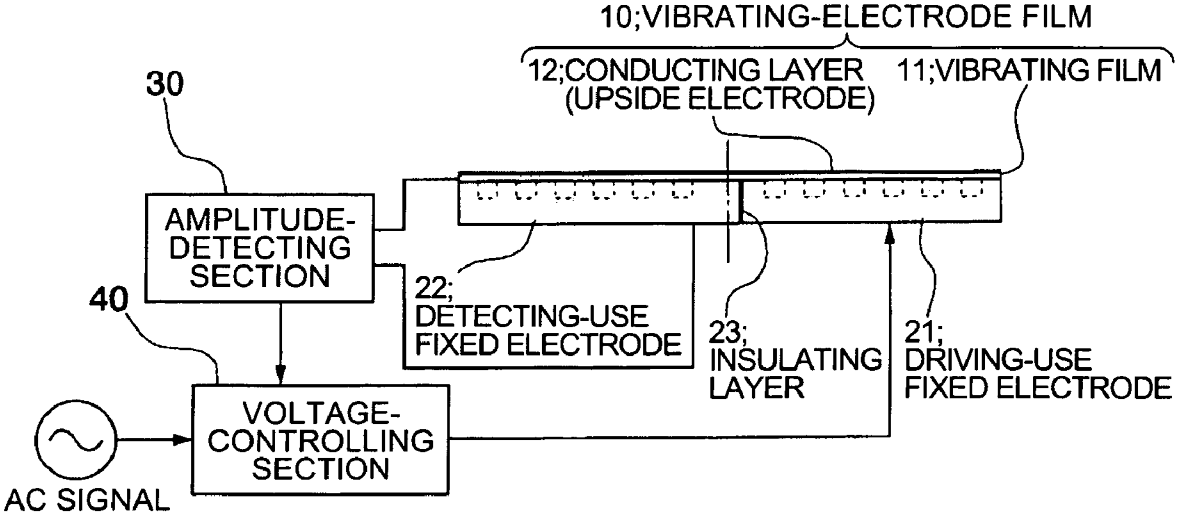
Figure 2:
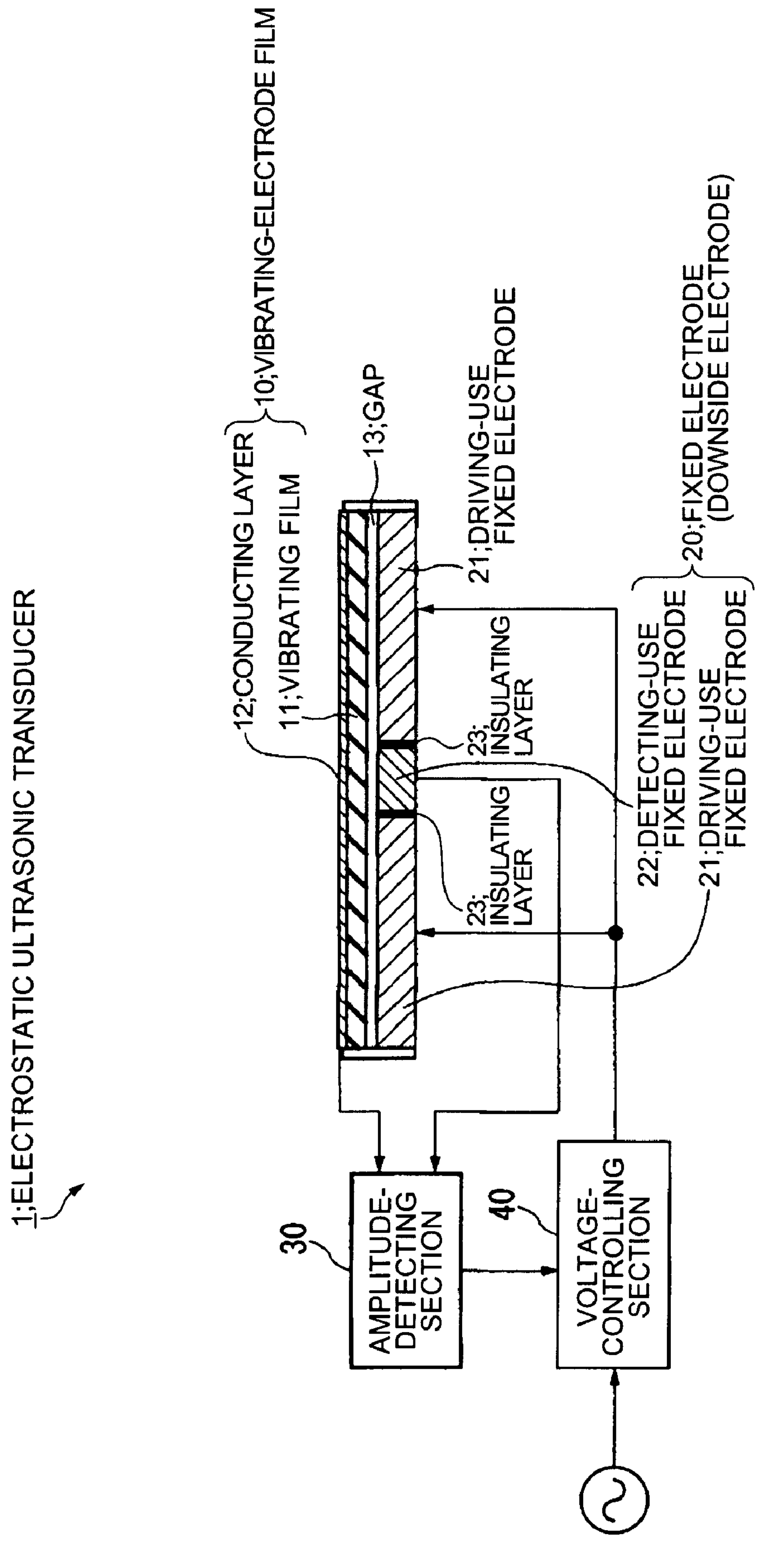
FIG. 2 is a view showing a second example of arrangement of an ultrasonic transducer according to the invention.

FIGS. 1 and 2 are views showing a first example of arrangement of an ultrasonic transducer according to the invention. The ultrasonic transducer 1 shown in FIGS. 1A and 1B is a round pull type electrostatic ultrasonic transducer. Of the drawings, FIG. 1A is a top view of the ultrasonic transducer 1, which is viewed from the side of the conducting layer 12 toward the fixed electrode 20. In FIG. 1A, the transducer 1 is illustrated with the upper left half of the conducting layer 12 taken away for easy understanding. FIG. 1B is a sectional view of the ultrasonic transducer shown in FIG. 1A, which is taken along the line A-A'.

The ultrasonic transducer 1 includes: a vibrating-electrode film 10, which is composed of a vibrating film 11 as an insulator (e.g. insulating film) and a conducting layer (upside electrode) 12 provided on a top surface of the vibrating film 11 by vapor deposition, etc.; and a fixed electrode (downside electrode) 20 opposed to the vibrating film 11.

The fixed electrode 20 has concentrically circular reentrant and protrudent portions formed in its surface, and has the structure in which electrodes insulated from each other by an insulating layer 23 are disposed adjacently. Of the fixed electrode 20, a part is connected with a voltage-controlling section 40 and used as a driving-use fixed electrode 21 for driving the ultrasonic transducer 1 when an AC signal is applied to them; and a part is connected with an amplitude-detecting section 30 and used as a detecting-use fixed electrode 22 for detecting the amplitude information of the vibrating film.

In the example shown in FIG. 1, the detecting-use fixed electrode 22 is provided extending across the fixed electrode 20 in a diametric direction of the circle. The detecting-use fixed electrode 22 is connected with the amplitude-detecting section 30. Based on the amplitude information of the vibrating-electrode film 10 detected by the amplitude-detecting section 30, the voltage-controlling section 40 regulates an AC signal (drive voltage) to be supplied to the driving-use fixed electrode 21 so that the vibrating film 11 vibrates symmetrically in plus and minus directions in its amplitude in response to a plus and minus symmetrical input signal. The arrangements and operations of the amplitude-detecting section 30 and voltage-controlling section 40 are to be described later in detail.

The example shown in FIGS. 1A and 1B is an ultrasonic transducer having a driving-use fixed electrode 21 with reentrant and protrudent portions, in which the vibrating film 11 is held so as to be in contact with the protrudent portions of the fixed electrode 20. According to the arrangement, cavities are only formed between the reentrant portions of the fixed electrode 20 and the vibrating film 11, and thus the vibrating film 11 is vibrated only at the portions thereof corresponding to the reentrant portions (the amplitude area is reduced). This improves the sensitivity (capability to respond) in the ultrasonic wave band. In this case, the arrangement is suitable for ultrasonic speakers. Incidentally, the transducer may be arranged so that a gap (i.e. cavity) 13 is provided extending all over the space between the vibrating film 11 and the fixed electrode 20.

Figure 4A:
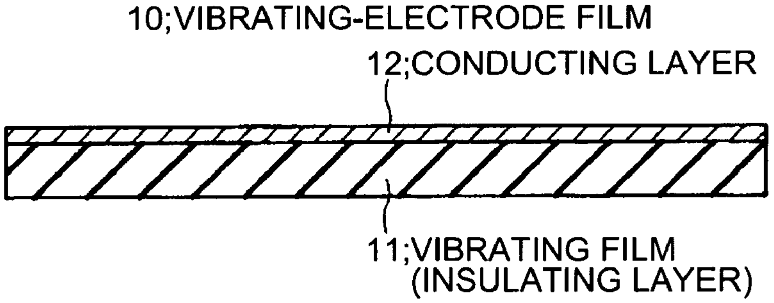
FIGS. 4A and 4B are views showing an example of arrangement of the vibrating-electrode film.
Figure 4B:
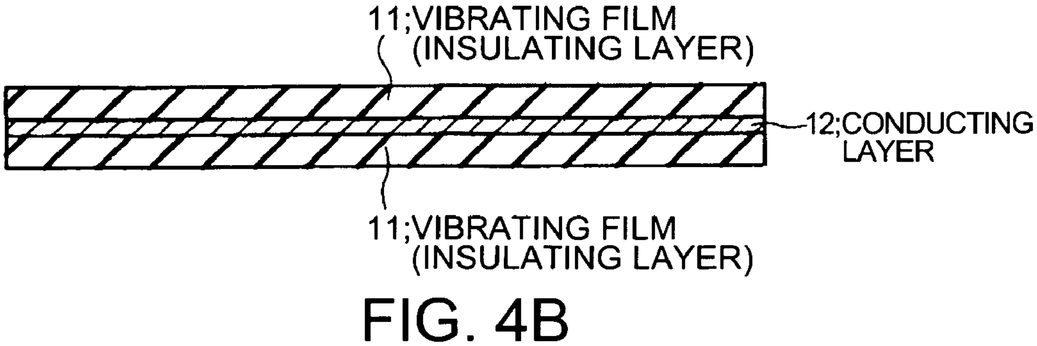

FIGS. 4A and 4B are views showing arrangement examples of the vibrating-electrode film. Of the drawings, FIG. 4A shows an example in which the conducting layer 12 is formed on a top surface of the vibrating film (insulating layer) 11. FIG. 4B shows an example of the vibrating-electrode film, in which the conducting layer 12 is formed so as to be sandwiched by the vibrating films (insulating layers) 11.

FIG. 2 is a view showing, in section, a second example of arrangement of an ultrasonic transducer according to the invention. The ultrasonic transducer 1 shown in FIG. 2 is a pull type electrostatic ultrasonic transducer. The ultrasonic transducer 1 includes: a vibrating-electrode film 10, which is composed of a vibrating film 11 as an insulator (e.g. insulating film) and a conducting layer (upside electrode) 12 provided on a top surface of the vibrating film 11 by vapor deposition, etc.; and a fixed electrode (downside electrode) 20 opposed to the vibrating film 11.

The fixed electrode 20 has the structure in which electrodes insulated from each other by an insulating layer 23 are disposed adjacently. Of the fixed electrode 20, a part is connected with a voltage-controlling section 40 and used as a driving-use fixed electrode 21 for driving the ultrasonic transducer 1 when an AC signal is applied to them; and a part is connected with an amplitude-detecting section 30 and used as a detecting-use fixed electrode 22 for detecting the amplitude information of the vibrating film.

Based on the amplitude information of the vibrating-electrode film 10 detected by the amplitude-detecting section 30, the voltage-controlling section 40 regulates an AC signal (drive voltage) to be supplied to the driving-use fixed electrode 21 so that the vibrating film 11 vibrates with its amplitude kept bilaterally symmetrical in response to a plus and minus symmetrical input signal. The arrangements and operations of the amplitude-detecting section 30 and voltage-controlling section 40 are to be described later in detail.

Figure 3:
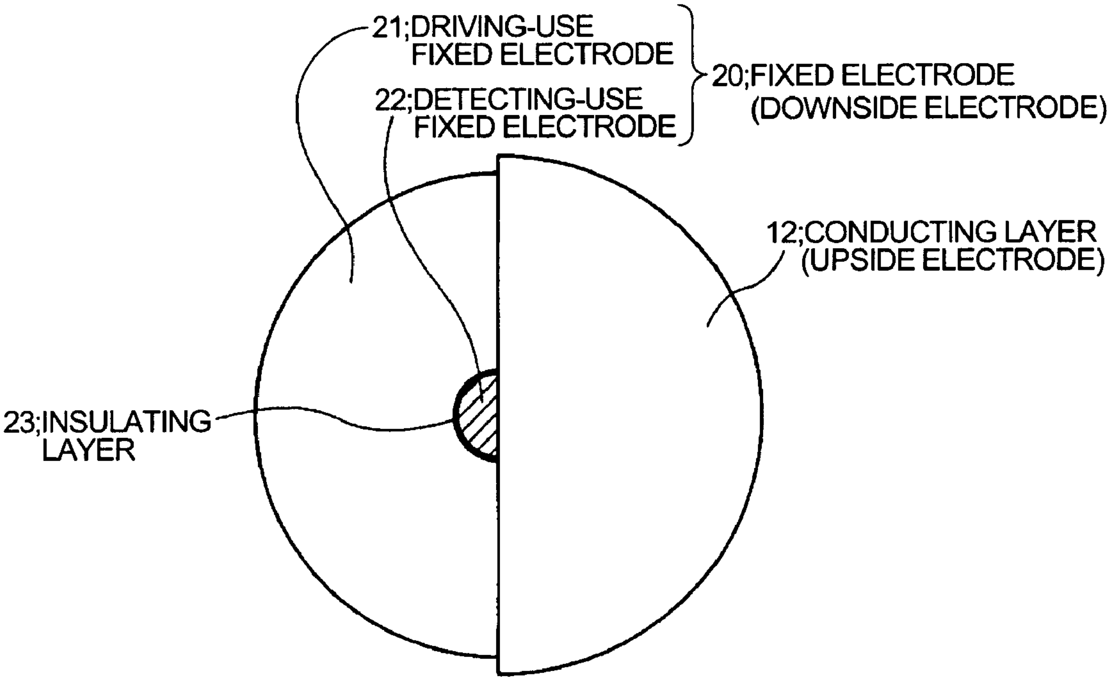
FIG. 3 is a top view of the ultrasonic transducer shown in FIG. 2.

FIG. 3 is a top view of the ultrasonic transducer shown in FIG. 2, which is viewed from the side of the conducting layer 12 toward the fixed electrode 20. In FIG. 3, the transducer is illustrated with the left half of the conducting layer 12 taken away for easy understanding.

Figure 5A:
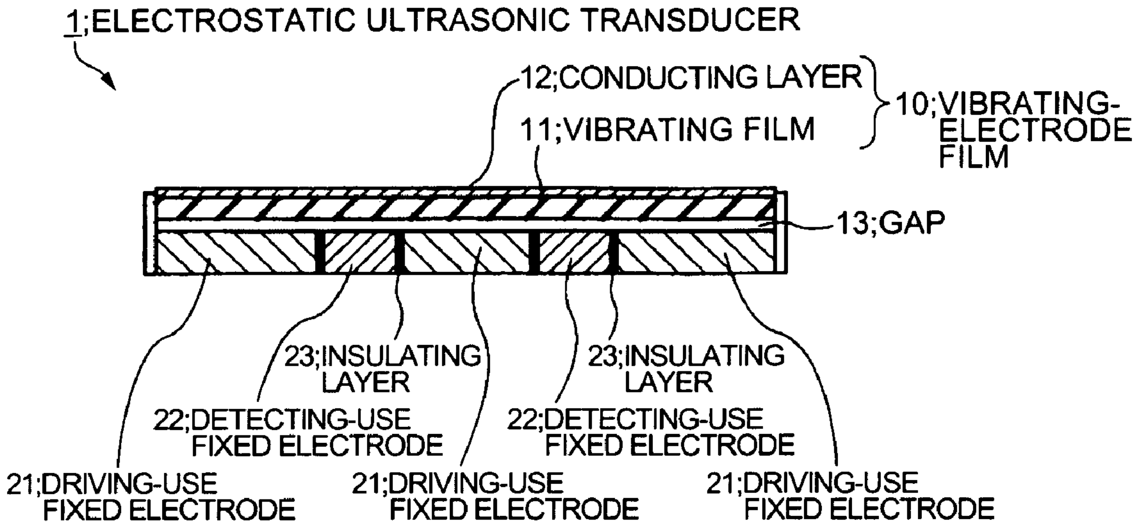
FIGS. 5A and 5B are views showing a third example of arrangement of an ultrasonic transducer according to the invention.
Figure 5B:
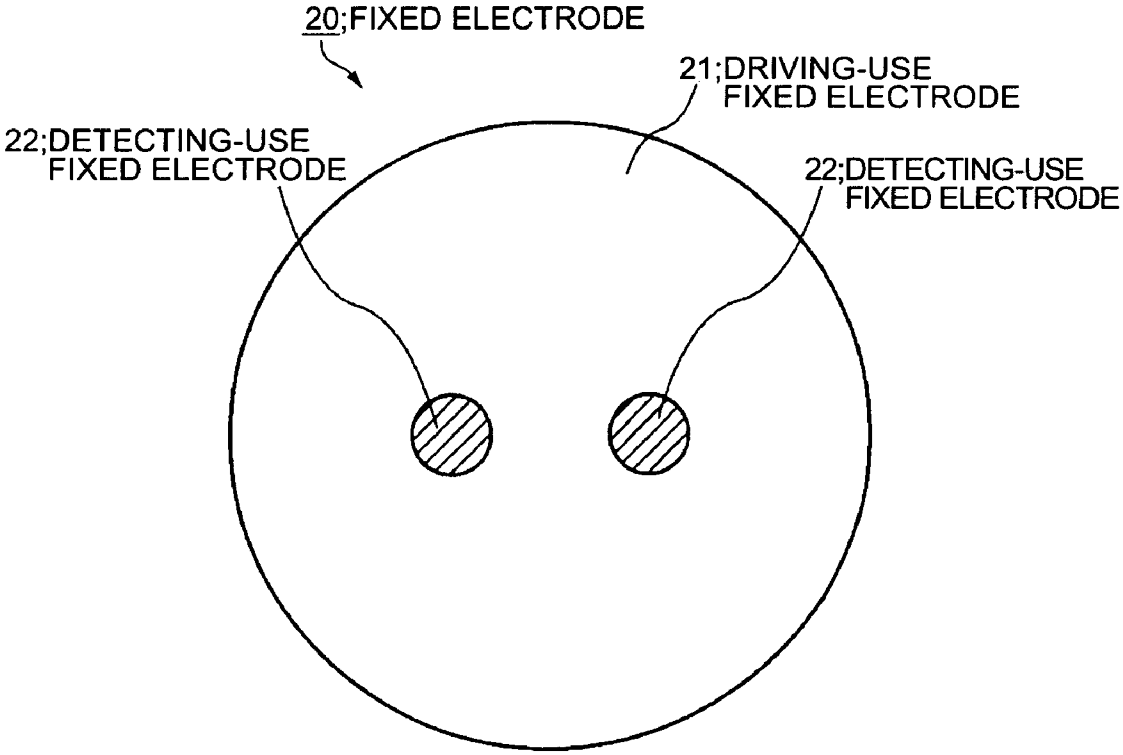

FIGS. 5A and 5B are views showing a third example of arrangement of an ultrasonic transducer according to the invention, in which two or more detecting-use fixed electrodes are used. Of the drawings, FIG. 5A is a sectional view, and FIG. 5B is an illustration of the fixed electrode 20 when it is viewed from the side of the vibrating-electrode film 10. In the example shown in the drawings, two detecting-use fixed electrodes 22 are provided in locations offset from the center, and the average value of amplitude voltages obtained from the two detecting-use fixed electrodes 22 is used as a detected output. When two or more detecting-use fixed electrodes 22 are provided in this way, it becomes possible to use a center portion, where a maximum amplitude can be picked up, as the driving-use fixed electrode 21. The number of the detecting-use fixed electrodes 22 may be three or more.

The ultrasonic transducers shown in FIGS. 2 and 5A, 5B are examples in which a gap (cavity) is provided extending entirely over the space between the vibrating film 11 and the fixed electrode (downside electrode) 20 so as to vibrate the transducer entirely. These are examples of arrangement suitable for loudspeakers in which emphasis is put on reproduction in an audible sound band.

While the fixed electrode 20 in the examples shown in FIGS. 1A, 1B, 2, and 5A, 5B is round, the shape of the fixed electrode 20 may be formed in an elliptical or a rectangular shape. Further, in the example shown in FIGS. 1A and 1B, the reentrant and protrudent portions of the fixed electrode 20 are formed in concentric circles, however the reentrant and protrudent portions of the fixed electrode 20 may be formed in straight lines (i.e. slits).

Principle of Amplitude Detection, and Arrangement and Operation of Amplitude-Detecting Section The principle of amplitude detection is similar to the principle of detection for a capacitor microphone. Since a capacitor is formed between the conducting layer (upside electrode) 12 of the vibrating-electrode film 10 and the detecting-use fixed electrode 22, when the vibrating film 11 vibrates to fluctuate the gap between the conducting layer 12 and detecting-use fixed electrode 22, the capacitance of the capacitor is changed, thereby changing the quantity of electric charge induced by the capacitor. As a result, the voltage between the capacitor and electrodes is changed. Therefore, the gap between the vibrating film 11 and the detecting-use fixed electrode 22, namely the amplitude can be detected by detecting the voltage between the conducting layer (upside electrode) 12 of the vibrating-electrode film 10 and the detecting-use fixed electrode 22.

Figure 6:
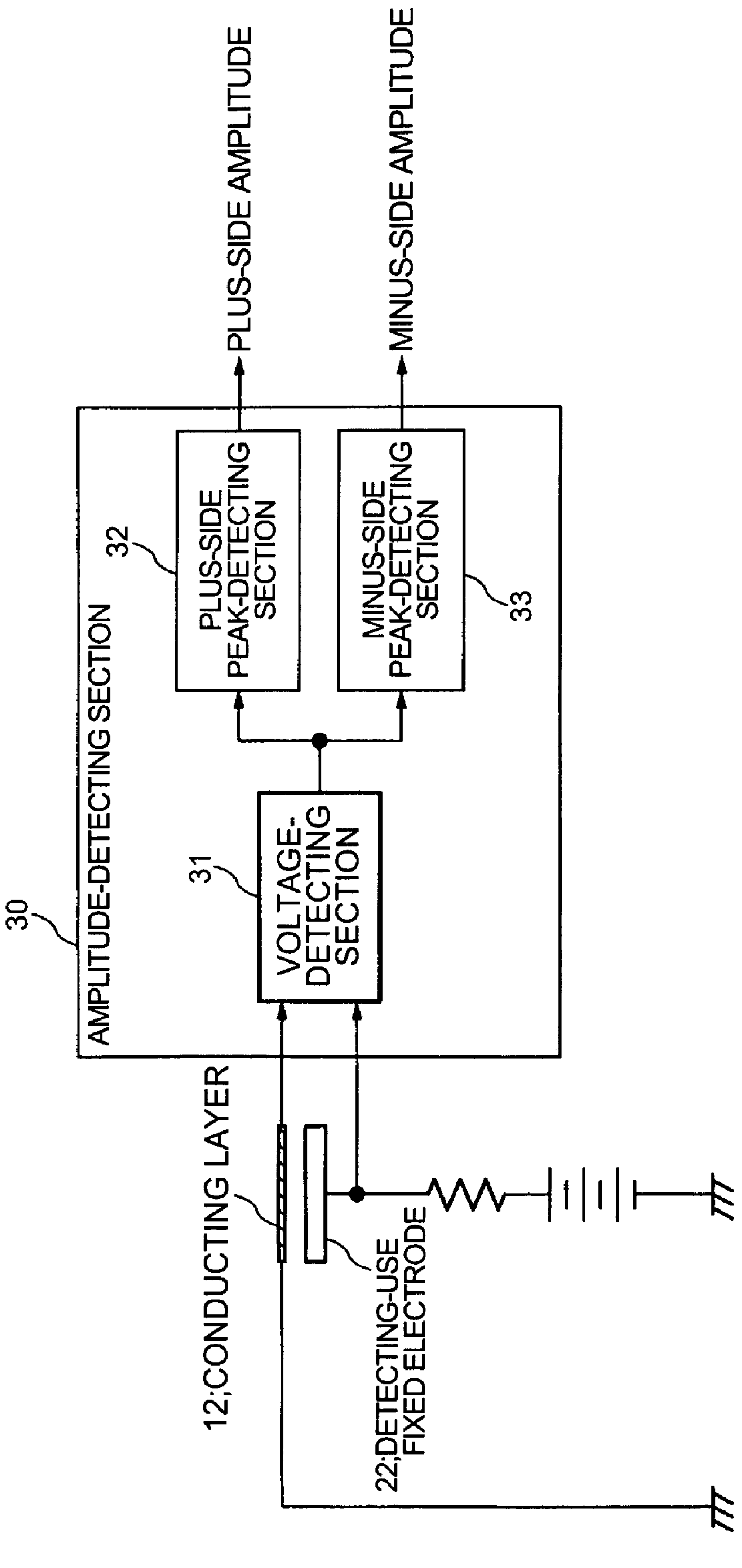
FIG. 6 is a view showing an example of arrangement of the amplitude-detecting section.

An example arrangement of the amplitude-detecting section is shown in FIG. 6. In the example shown in FIG. 6, the amplitude-detecting section 30 is arranged as described below. The voltage-detecting section (amplitude voltage-detecting unit) 31 detects the voltage between the conducting layer (upside electrode) 12 of the vibrating-electrode film 10 and the detecting-use fixed electrode 22 and then a peak-detecting section detects a maximum point of the detected voltage waveform, whereby the amplitude is detected.

In addition, the amplitude-detecting section 30 is arranged so that the signal waveform detected by the voltage-detecting section 31 is input to a plus (+) side peak-detecting section (plus-side amplitude voltage level-detecting unit) 32 and a minus (−) side peak-detecting section (minus-side amplitude voltage level-detecting unit) 33, followed by detecting peak values of plus-side and minus-side amplitudes of the vibrating film 11 respectively. This makes it possible to detect amplitude states of the vibrating film 11 with respect to plus and minus drive signals and therefore enables the detection of an asymmetrical distortion in the vibrating film 11.

Arrangement and Operation of Voltage-Controlling Section

Figure 7:
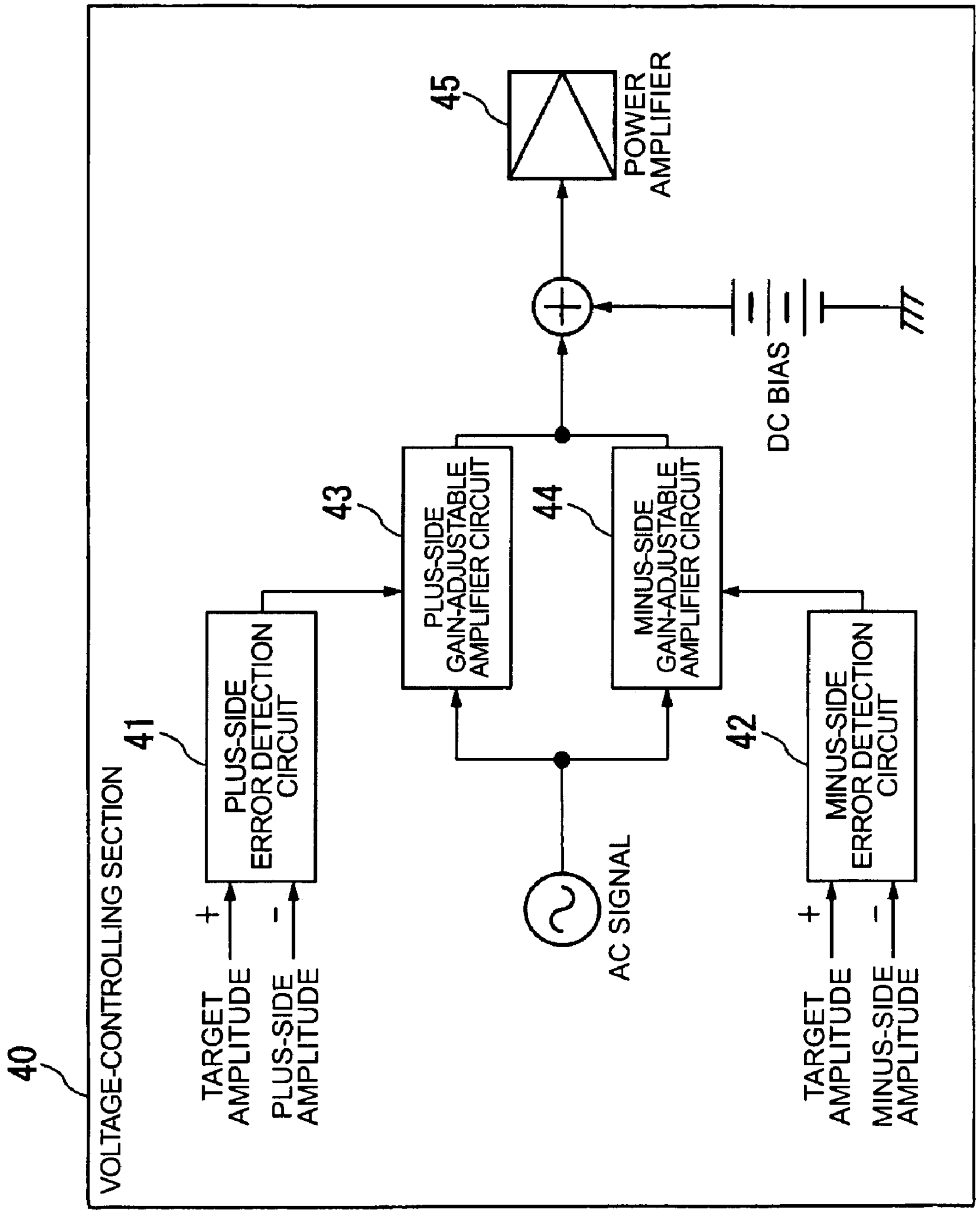
FIG. 7 is a view showing an example of arrangement of the voltage-controlling section.
Figure 8A:
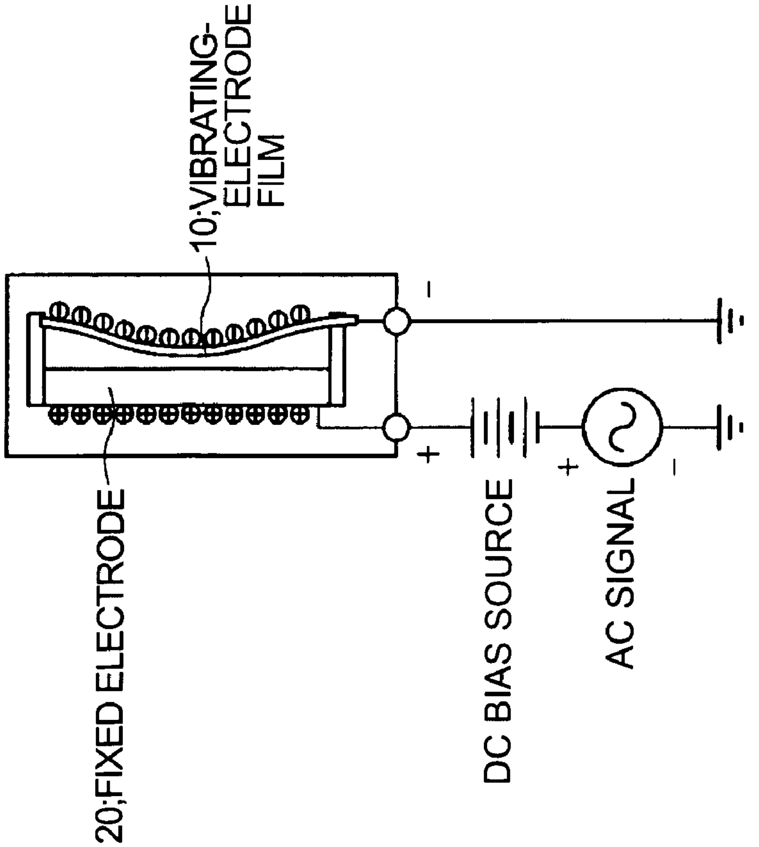
FIGS. 8A and 8B are views of explaining the concept for driving a pull type electrostatic ultrasonic transducer.
Figure 8B:
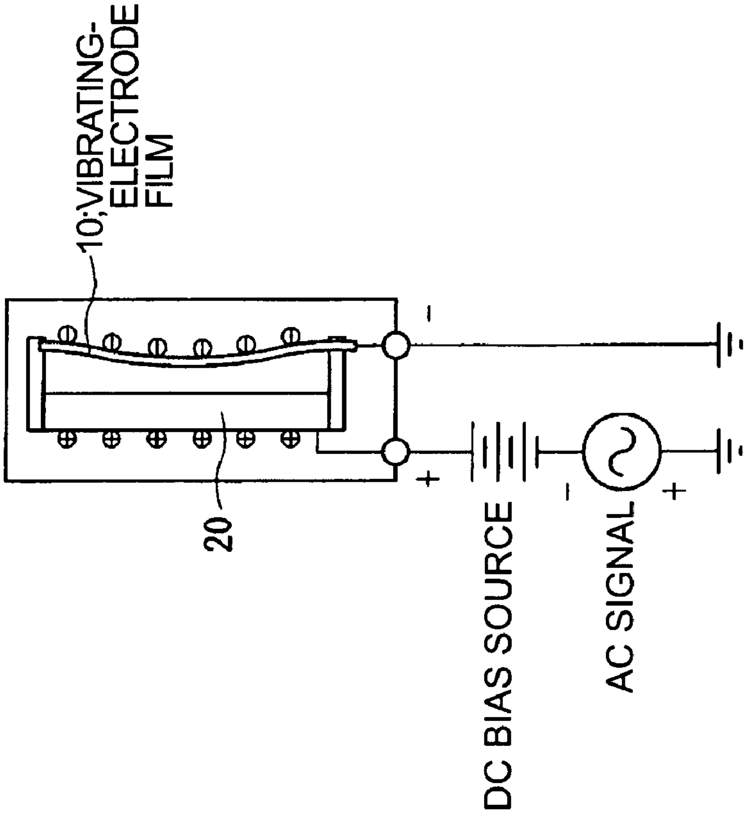
Figures 9A, 9B, 9C:
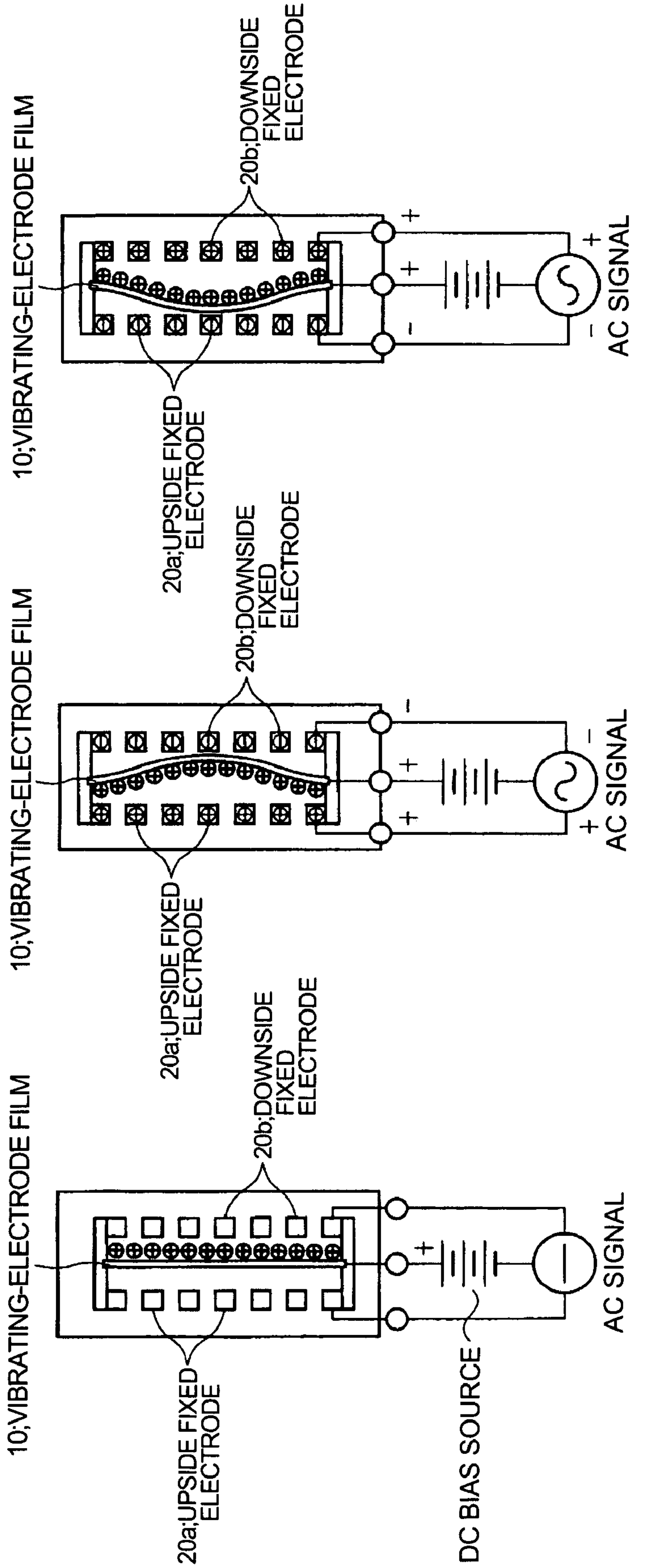
FIGS. 9A-9C are views of explaining the concept for driving a push-pull type electrostatic ultrasonic transducer.
Figure 10:
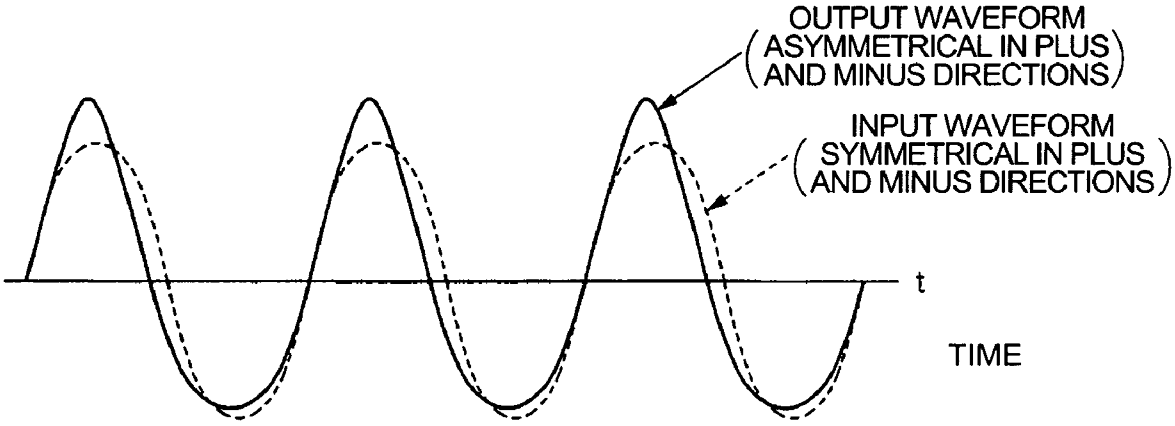
FIG. 10 is a view showing an exemplary distortion of a vibrating waveform asymmetrical in up and down directions.

FIG. 7 is a view showing an example of arrangement of the voltage-controlling section. The voltage-controlling section 40 includes: a plus-side error detection circuit (plus-side error-detecting unit) 41; a minus-side error detection circuit (minus-side error-detecting unit) 42; a plus-side gain-adjustable amplifier circuit (plus-side variable gain-regulating unit) 43; a minus-side gain-adjustable amplifier circuit (minus-side variable gain-regulating unit) 44; and a power amplifier 45. As shown in FIG. 7, the voltage-controlling section 40 is arranged so that plus-side and minus-side waveforms of an AC signal (input signal) are amplified separately.

The plus-side error detection circuit 41 outputs deviations from a target amplitude for plus-side amplitudes of the vibrating film detected by the amplitude-detecting section 30. The minus-side error detection circuit 42 outputs deviations from a target amplitude for minus-side amplitudes of the vibrating film detected by the amplitude-detecting section 30.

In this case, the target amplitude with respect to a drive voltage may be associated previously. Alternatively, the amplitude detected at one detecting electrode may be set as a target amplitude for its opposing electrode.

The plus-side gain-adjustable amplifier circuit 43 amplifies a plus-side drive signal while adjusting the gain of the amplifier circuit according to the amount of deviation from the target amplitude output by the plus-side error detection circuit 41. In the amplifier circuit 43, the gain is increased when a detected amplitude is smaller in comparison to the target amplitude (plus deviation), and decreased when a detected amplitude is larger (minus deviation).

The minus-side gain-adjustable amplifier circuit 44 amplifies a minus-side drive signal while adjusting the gain of the amplifier circuit according to the amount of deviation from the target amplitude output by the minus-side error detection circuit 42. In the amplifier circuit 44, the gain is increased when a detected amplitude is smaller in comparison to the target amplitude (plus deviation), and decreased when a detected amplitude is larger (minus deviation).

After the gain adjustment is performed according to the deviations of amplitudes respectively on the plus and minus sides in this way, the waveforms are combined, on which a DC bias is superimposed. After that, its electric power amplification is performed by the power amplifier 45 and then a drive signal is supplied to the driving-use fixed electrode 21 of the electrostatic ultrasonic transducer 1.

The voltage-controlling section 40 may be arranged so that an output transformer (not shown) is located between the power amplifier and the transducer to superimpose a DC bias in the output transformer, instead of superimposing a DC bias in the preceding stage of the power amplifier 45.

Basically, the gain adjustments by the plus-side gain-adjustable amplifier circuit 43 and the minus-side gain-adjustable amplifier circuit 44 are performed automatically. However, such adjustments(setting) may be made manually (or by hand). For example, if such adjustments are performed manually (or by hand) in advance at the time of factory shipment, ultrasonic transducers can be shipped in the best condition.

While the embodiments of the invention have been described above, the ultrasonic transducer of the invention is not limited to the above examples shown in the drawings. Various modifications and changes may be made within a range not deviating from the subject matter of the invention.

What is claimed is:

1. An ultrasonic transducer, comprising:

a fixed electrode;

a vibrating film placed opposite to a surface of the fixed electrode and having a conducting layer;

a member that holds the fixed electrode and vibrating film;

the fixed electrode including:

a driving-use fixed electrode receiving an AC signal to drive the ultrasonic transducer at a desired amplitude, and a detecting-use fixed electrode formed to detect an amplitude of the vibrating film; and a control unit that controls the AC signal applied to the driving-use fixed electrode based on a comparison of the magnitude of the amplitude of the vibrating film detected by the detecting-use fixed electrode and the amplitude of an input signal received by the control unit so that the amplitude of the vibration of the vibrating film approximates the amplitude of the input signal, wherein when an alternating current (AC) signal is applied between the fixed electrode and the conducting layer of the vibrating film, the ultrasonic transducer generates an ultrasonic wave.

2. The ultrasonic transducer of claim 1, wherein the fixed electrode has a plurality of electrodes insulated from each other;

a part of the fixed electrode comprises the driving-use fixed electrode; and a part of the fixed electrode comprises the detecting-use fixed electrode for amplitude detection.

3. The ultrasonic transducer of claim 1, wherein the vibrating film comprises an insulative film having a conducting layer formed on one side thereof covering the insulative film; and the other side of the insulative film is held opposite to the fixed electrode.

4. The ultrasonic transducer of claim 1, wherein a gap is provided between the fixed electrode and vibrating film.

5. The ultrasonic transducer of claim 1, wherein reentrant and protrudent portions are formed in a surface of the fixed electrode opposite to the vibrating film.

6. The ultrasonic transducer of claim 1, further comprising:

an amplitude voltage-detecting unit that measures a voltage between the detecting-use fixed electrode and the conducting layer of the vibrating film to detect an amplitude voltage produced by an amplitude of the vibrating film;

a plus-side amplitude voltage level-detecting unit that detects a plus side amplitude voltage level of the amplitude voltage detected by the amplitude voltage-detecting unit; and a minus-side amplitude voltage level-detecting unit that detects a minus side amplitude voltage level of the amplitude voltage detected by the amplitude voltage-detecting unit.

7. The ultrasonic transducer of claim 6, further comprising:

a plus-side error-detecting unit that detects an error between the plus-side amplitude voltage level detected by the plus-side amplitude voltage level-detecting unit and a targeted voltage level;

a minus-side error-detecting unit that detects an error between the minus-side amplitude voltage level detected by the minus-side amplitude voltage level-detecting unit and a targeted voltage level;

a plus-side variable gain-regulating unit that regulates a plus-side gain of the AC signal to be applied to the driving-use fixed electrode based on a result of error detection by the plus-side error-detecting unit; and a minus-side variable gain-regulating unit that regulates a minus-side gain of the AC signal to be applied to the driving-use fixed electrode based on a result of error detection by the minus-side error-detecting unit.

8. The ultrasonic transducer of claim 7, further comprising a manual regulation unit that allows gains for the plus-side variable gain-regulating unit and minus-side variable gain-regulating unit to be regulated manually.

9. An ultrasonic speaker, comprising:

the ultrasonic transducer of claim 1; and a modulation unit that modulates a carrier of an ultrasonic wave band with an acoustic signal of an audio band to create a modulated wave, the ultrasonic speaker being arranged so that the modulated wave is supplied to the ultrasonic transducer from the modulation unit.

10. A method of driving and controlling an ultrasonic transducer having a fixed electrode, a vibrating film placed opposite to a surface of the fixed electrode and having a conducting layer, a member that holds the fixed electrode and the vibrating film, wherein the ultrasonic transducer generates an ultrasonic wave when an AC signal is applied between the fixed electrode and the conducting layer of the vibrating film, comprising the steps of:

using a part of the fixed electrode as a driving-use fixed electrode to drive the ultrasonic transducer and using a part of the fixed electrode as a detecting-use fixed electrode to detect an amplitude of the vibrating film;

comparing the amplitude of an input signal to an amplitude of the vibrating film;

outputting an error based on the comparison of the amplitude of the input signal to the amplitude of the vibrating film; and controlling the AC signal applied to the driving-use fixed electrode based on the error between the amplitude of the input signal and the amplitude of the vibrating film so that the amplitude of the vibrating film approximates the amplitude of the input signal.

11. The method of driving and controlling an ultrasonic transducer of claim 10, further comprising the steps of:

measuring a voltage between the detecting-use fixed electrode and the conducting layer of the vibrating film to detect an amplitude voltage produced by the amplitude of the vibrating film;

detecting a plus side amplitude voltage level of the amplitude voltage detected in the amplitude voltage detecting step;

detecting a minus side amplitude voltage level of the amplitude voltage detected in the amplitude voltage detecting step;

detecting an error between the plus-side amplitude voltage level detected in the plus-side amplitude voltage level detecting step and a targeted voltage level;

detecting an error between the minus-side amplitude voltage level detected in the minus-side amplitude voltage level detecting step and a targeted voltage level;

regulating a plus-side gain of the AC signal to be applied to the driving-use fixed electrode based on a result of error detection according to the plus-side error detecting step; and regulating a minus-side gain of the AC signal to be applied to the driving-use fixed electrode based on a result of error detection according to the minus-side error detecting step.

* * * * *